United States Patent
Marrah et al.

[11] Patent Number: 5,937,337
[45] Date of Patent: *Aug. 10, 1999

[54] METHOD AND APPARATUS FOR REDUCING FM INTRUSION IN AM RECEIVERS

[75] Inventors: Jeffrey Joseph Marrah; Linh Ngoc Pham; Michael John Easterwood, all of Kokomo, Ind.

[73] Assignee: Delco Electronics Corporation, Kokomo, Ind.

[*] Notice: This patent issued on a continued prosecution application filed under 37 CFR 1.53(d), and is subject to the twenty year patent term provisions of 35 U.S.C. 154(a)(2).

[21] Appl. No.: 08/715,905

[22] Filed: Sep. 23, 1996

[51] Int. Cl.⁶ .................................................. H04B 17/02
[52] U.S. Cl. .......................... 455/142; 455/144; 455/150.1
[58] Field of Search .................................... 455/142, 143, 455/144, 140, 150.1, 161.1, 161.2, 200.1

[56] References Cited

U.S. PATENT DOCUMENTS

| | | | |
|---|---|---|---|
| 3,389,338 | 6/1968 | Slavin | 455/143 |
| 3,472,967 | 10/1969 | Wofford et al. | 455/142 |
| 3,710,143 | 1/1973 | Bray et al. | 455/143 |
| 3,755,763 | 8/1973 | Hoshi | 455/142 |
| 4,034,298 | 7/1977 | McFadyen et al. | 455/143 |
| 4,135,158 | 1/1979 | Parmet | 455/143 |

*Primary Examiner*—Reinhard J. Eisenzopf
*Assistant Examiner*—Darnell R. Armstrong
*Attorney, Agent, or Firm*—Jimmy L. Funke

[57] ABSTRACT

A technique for reducing FM intrusion in an AM section of an AM/FM receiver. In one embodiment, a first switch is provided between an FM tuner filter circuit and an AM tuner circuit. A second switch is provided between the FM tuner circuit and a reference potential. When the receiver is in an FM mode, the first switch is closed so that a tuning voltage can be applied to the FM tuner circuit, and the second switch is open to prevent the tuning voltage from being affected by the reference potential. When the receiver is switched to the AM mode, the first switch is open to prevent intermodulation product signals generated by the FM tuner circuit from reaching the AM tuner circuit, and the second switch is closed to connect the FM tuner circuit to the reference potential. By connecting the FM tuner circuit to the reference potential when the receiver is in the AM mode, the tuning of the FM tuner circuit is shifted out of the FM bandwidth, thus eliminating intermodulation products at the AM frequencies. In an alternate embodiment, a switch is provided to switch off the power to the FM front end when in the AM mode.

9 Claims, 2 Drawing Sheets

METHOD AND APPARATUS FOR REDUCING FM INTRUSION IN AM RECEIVERS

BACKGROUND OF THE INVENTION

1. Field of the Invention

This invention relates generally to a technique for reducing FM intrusion in an AM receiver and, more particularly, to a circuit design technique for reducing the intermodulation products produced by the FM front end circuity of an AM/FM receiver that effect AM reception when the receiver is in the AM mode by switching an FM tuned tank circuit to a reference potential.

2. Discussion of the Related Art

As is well understood in the art, radio receivers are responsive to radio frequency (RF) signals broadcast from a transmission antenna to convert the signals into a desirable format, such as speech or music. An antenna associated with the receiver captures the electromagnetic energy of the RF signals from the surroundings, and converts this energy into electrical currents that are subsequently processed. Typically, a radio receiver will be separated into an amplitude modulation (AM) portion and a frequency modulation (FM) portion. In the United States, the AM portion is tunable to RF signals in the frequency band from 530 to 1710 kHz, and the FM portion is tunable to RF signals in the frequency band from 88.1 to 107.9 MHz.

There are many things that affect reception capabilities of the received RF signal, resulting in a poor signal-to-noise ratio. The RF signal can become very weak, or attenuated, and not be able to overcome noise sources in the receiver. This occurs because of many reasons, such as low power transmission, distance of the receiver from the transmitter, obstacles between the transmitter and the receiver, etc. Further, there can be one or more high-power, adjacent, alternate or co-channel signals present which causes interference and degrades the desired signal quality.

Strong RF signals can provide problems as well. The electrical circuitry in the front end of a radio receiver provides selectivity, amplification and frequency translation. This circuitry includes active components which are only linear over limited voltage ranges. The presence of strong RF signals can force these components into their non-linear operating ranges. The result can be intermodulation products which are additional frequency components that were not present in the RF signals, and were generated as a result of the non-linearity in the system circuitry.

FM intrusion is a problem that may exist in an AM receiver as a result of the reception of strong FM signals. FM intrusion is an intermodulation product condition that results from two FM frequencies that are spaced apart by a band width that is in the AM frequency band. In the United States, FM transmissions are regulated to be spaced 200 kHz apart. This difference in adjacent FM transmissions results in frequencies that could fall in the AM frequency band range at 600, 800, 1000, 1200, 1400 and 1600 kHz. If two FM broadcast sources are positioned geographically close together, are sufficiently strong and are a derivative of 200 kHz apart, FM intrusion may become a problem. In other parts of the world FM stations are spaced 100 kHz apart which results in more opportunity for FM intrusion within the AM band.

Many prior art techniques have been attempted to improve FM intrusion in the AM portion of the receivers. These methods generally either try to improve the linear range of the front end circuitry of the AM receiver, or use filtering techniques to keep the 200 kHz frequency components from getting into the AM receiver section of an AM/FM receiver. One particular technique uses an isolation choke positioned in series with the input to the AM section of the receiver. The isolation choke is a high impedance device to the high frequency components of the FM signal, and a low impedance device to the lower frequency AM signal. Therefore, the FM signals are prevented from reaching the AM tuner in the AM portion of the receiver.

The above described isolation choke has been relatively successful in preventing FM signals from reaching the AM tuner directly from the receiver antenna. However, the FM signals have been able to reach the AM tuner along certain "sneak paths," i.e., unobvious connections in the circuitry. One particular sneak path is through the ground plane of the receiver. This allows the FM signals to reach the AM tuner circuitry, and thus provide a source of FM intrusion.

What is needed is a technique for further reducing intermodulation products and FM intrusion in a combination AM/FM receiver. It is therefore an object of the present invention to provide such a technique.

SUMMARY OF THE INVENTION

In accordance with the teachings of the present invention, a technique for reducing FM intrusion in an AM portion of an AM/FM receiver is disclosed. A first switch is provided between an FM tuner filter circuit and an AM tuner filter circuit. A second switch is provided between the FM tuner circuit and a reference potential. When the receiver is in an FM mode, the first switch is closed so that a tuning voltage can be applied to the FM tuner circuit, and the second switch is opened to prevent the tuning voltage from being affected by the reference potential. When the receiver is switched to the AM mode, the first switch is open to prevent intermodulation product signals generated by the FM tuner circuit from reaching the AM tuner circuit, and the second switch is closed to connect the FM tuner circuit to the reference potential. By connecting the FM tuner circuit to the reference potential when the receiver is in the AM mode, the FM tuner circuit is detuned and is shifted out of the FM bandwidth, thus eliminating intermodulation products generated within the FM circuit from causing FM intrusion at the AM frequencies. In an alternate embodiment, a switch is provided to switch off the power supply to the FM front end, thus eliminating it as an active device.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments directed to a technique for reducing intermodulation products and FM intrusion in an AM/FM radio receiver is merely exemplary in nature, and is in no way intended to limit the invention or its applications or uses.

Figure 1:
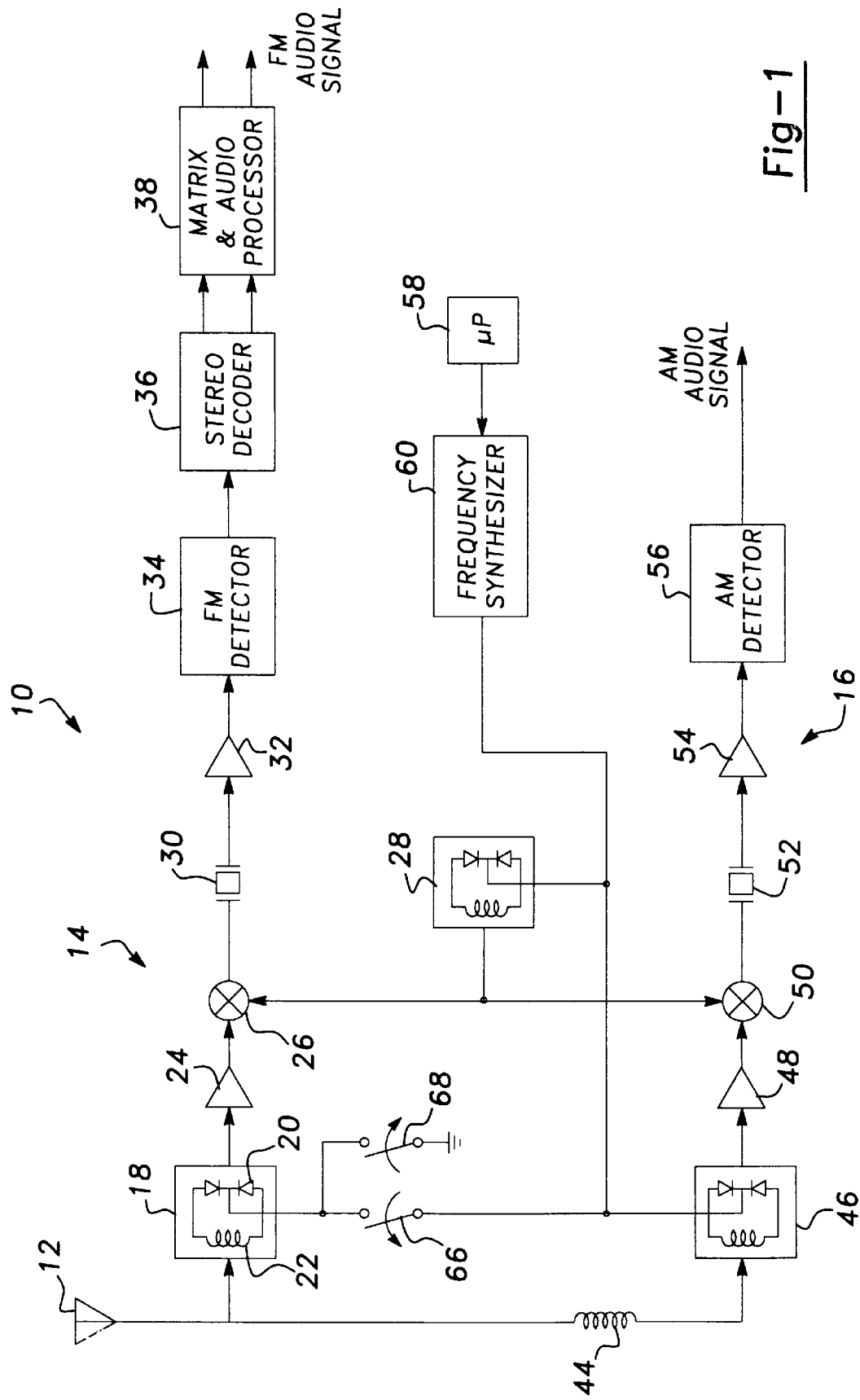
FIG. 1 is a schematic block diagram of an AM/FM receiver including circuitry for minimizing intermodulation products causing FM intrusion, according to one embodiment of the present invention.

FIG. 1 shows a schematic block diagram of an AM/FM radio receiver 10 that is responsive to RF signals, and can be tuned in both the AM and FM radio frequency band widths. The AM/FM radio receiver 10 is intended to represent various types of superheterodyne AM/FM receivers known in the art, and is especially intended to represent such a radio receiver for use in a vehicle. Although the various components of the receiver 10 will be discussed generally below, it is understood that these components would be well understood to those skilled in the art. Additionally, the receiver 10 would be microprocessor controlled in a modern application, and such control would be readily apparent to those skilled in the art.

Electromagnetic energy in the form of RF signals is received by a radio frequency antenna 12, and are applied to an FM receiver section 14 and an AM receiver section 16. The receiver 10 can be selectively activated to be in either an AM mode or an FM mode where the receiver is tuned for AM or FM frequencies. The FM receiver section 14 includes a tunable filter circuit, particularly a tunable tank circuit 18, that is tuned to establish a band width having a particular and desirable center frequency. When the tank circuit 18 is tuned to a particular frequency in the FM frequency bandwidth, the RF signals received from the antenna 12 and applied to the tank circuit 18 at the tuned frequency are passed by the tank circuit 18, and frequencies outside of this bandwidth are rejected. The tank circuit 18 includes a pair of back-to-back varactor diodes 20 and a coil 22 that establishes the resonant frequency of the circuit 18. Other capacitive components would also be included in the tank circuit 18 to establish the resonant frequency. A voltage potential applied between the varactor diodes 20 acts to adjust the center frequency output of the tank circuit 18, and thus acts to tune the receiver 10 to a particular FM frequency.

The output of the tank circuit 18 is the RF signal received by the antenna 12 that is tuned by the circuit 18. This selected RF signal is applied to a low noise RF amplifier 24 to be amplified, and the amplified RF signal is applied to a mixer 26. The mixer 26 mixes the selected RF signal with an RF signal from a local oscillator 28, also a tuned tank circuit, to establish an intermediate frequency, for example 10.7 MHz, that is suitable for subsequent processing by the components of the FM section 14. The combination of the antenna 12, the tank circuit 18, the amplifier 24 and the mixer 26 is typically referred to as the "front end" of the FM section 14. The input to the mixer 26 from the local oscillator 28 is selected so that no matter what frequency the tank circuit 18 is tuned to, the intermediate frequency will always be the same. By establishing a common intermediate frequency in this manner, inexpensive, highly repeatable components can be used in the FM section 14 having suitable tolerances without the need for providing expensive components, such as other tunable filters, as is well understood in the art.

The intermediate frequency signal from the mixer 26 is applied to an intermediate frequency filter circuit 30. The filter circuit 30 provides the selectivity which isolates the desired station within the FM spectrum. The filter circuit 30 selects the desired FM station by employing narrow band filtering. The filtered intermediate frequency from the filter circuit 30 is applied to an intermediate frequency amplifier 32 to amplify the intermediate frequency for subsequent processing. Other types of filters can be used in place of the filter circuit 30, as would be appreciated by those skilled in the art.

The amplifier 32 amplifiers the intermediate frequency signal to a level high enough to drive an FM detector 34. The FM detector 34 extracts the transmitted information on the RF signal through a frequency-to-voltage conversion. The FM detector 34 can be any suitable detector for the purposes described herein, such as a quadrature circuit. The detected RF signal from the detector 34 is applied to a stereo decoder 36 that separates the signal into left+right (L+R) and left–right (L–R) channels. The separated signals from the stereo decoder 36 are applied to a matrix and audio processor 38 that converts the L+R and L–R signals into left and right audio signals. Left and right FM audio signal from the processor 38 are then applied to subsequent processing circuitry (not shown), and then to the system speakers (not shown). Each of the various components of the FM receiver section 14, discussed above, are well known, and thus need not be elaborated on here.

The RF signals received by the antenna 12 are also applied to the AM receiver section 16 through an isolation choke 44. The isolation choke 44 is a coil that acts as a high impedance to high frequency, such as the transmitted FM signals, and as a low impedance to the Low frequency of the AM signals. The AM section 16 includes a tunable RF filter, particularly a tank circuit 46, that operates in the same manner as the tank circuit 18 to be tuned to a desired AM frequency signal. The tuned RF signal from the circuit 46 is applied to a low noise amplifier 48 to be amplified, and then fed to a mixer 50. The mixer 50 mixes the tuned AM frequency signal with a signal from the local oscillator 28 to provide an intermediate frequency, for example 450 kHz, in the manner as described above. The tank circuit 46, the amplifier 48 and the mixer 50 act as the AM receiver section front end. The intermediate frequency signal from the mixer 50 is then applied to an intermediate frequency filter 52. An output of the filter circuit 52 is amplified by a low noise amplifier 54 so as to raise the signal level of the intermediate frequency signal to a level suitable to be detected by an AM detector 56. An output of the AM detector 56 is applied to subsequent processing circuitry before being applied to the speakers.

The AM/FM radio receiver 10 is microprocessor controlled by a microprocessor 58. When an operator of the receiver 10 selects the AM or FM mode, and a particular frequency by the controls of the receiver 10, the microprocessor 58 determines the desired frequency, and sends an output signal to a frequency synthesizer 60. Depending on the signal from the microprocessor 58, the frequency synthesizer 60 outputs a tuning voltage to the particular tank circuits 18, 28, 46 as shown. The voltage signals adjust the capacitances of the varactor diodes in these tank circuits so as to adjust the center frequency of the tuned tank circuit to the particular station desired, and set the appropriate intermediate frequency. The signal applied to the local oscillator 28 alters the frequency mixed with the selected RF frequencies to establish the common intermediate frequencies in the separate FM section 14 and the AM section 16. In this manner, each station along the AM and FM frequency bands can be selected for tuning.

As discussed above, because the signals received by the antenna 12 are applied to both the FM section 14 and the AM section 16, strong FM signals proximate in frequency to each other can result in intermodulation products and FM intrusion when the receiver 10 is in the AM mode, particularly when two strong FM signals that are a multiple of 200 kHz apart are received by the antenna 12. The isolation choke 44 prevents these FM signals from reaching the AM section 16 directly from the antenna 12. However, the various other connections between the FM section 14 and the AM section 16, including ground connections, provide alternate paths for these FM signals to reach the AM section 16. Thus, it may be important, in certain environments, to provide additional reduction of FM intrusion.

According to one embodiment of the present invention, FM intrusion is further reduced in the receiver 10 by providing a first switch 66 between the tank circuit 18 and the frequency synthesizer 60, and a second switch 68 between the tank circuit 18 and a reference potential connection, such as ground. Switching of the switches 66 and 68 is provided by a signal from the microprocessor 58, depending on whether the receiver 10 is in the AM or FM mode. When the operator selects the FM mode, the switch 66 is closed so that the tuning voltage from the frequency synthesizer 60 can reach the tank circuit 18, and the switch 68 is open preventing this signal from being affected by the reference potential. Thus, the FM section 14 is free to operate in its normal manner. However, when the receiver 10 is switched into the AM mode, the switch 66 is opened, thus preventing any intermodulation product signals generated by the tank circuit 18 from reaching the tank circuit 46, and the switch 68 is closed connecting the tank circuit 18 to the reference potential.

When the switches 66 and 68 are in this position for the AM mode, they act as a detuning technique for the tank circuit 18. When the tank circuit 18 is connected to the reference potential, the tank circuit 18 is shifted to a frequency out of the FM bandwidth, and thus does not provide intermodulation products at the 200 kHz frequencies. Because the tank circuit 18 is shifted out of the FM bandwidth, there is no FM intrusion. Although the switch 68 switches the tank circuit 18 to a ground potential in a preferred embodiment, this potential can be any reference potential which detunes the tank circuit 18 out of the FM frequency bandwidth, for example an eight volt potential.

Figure 2:
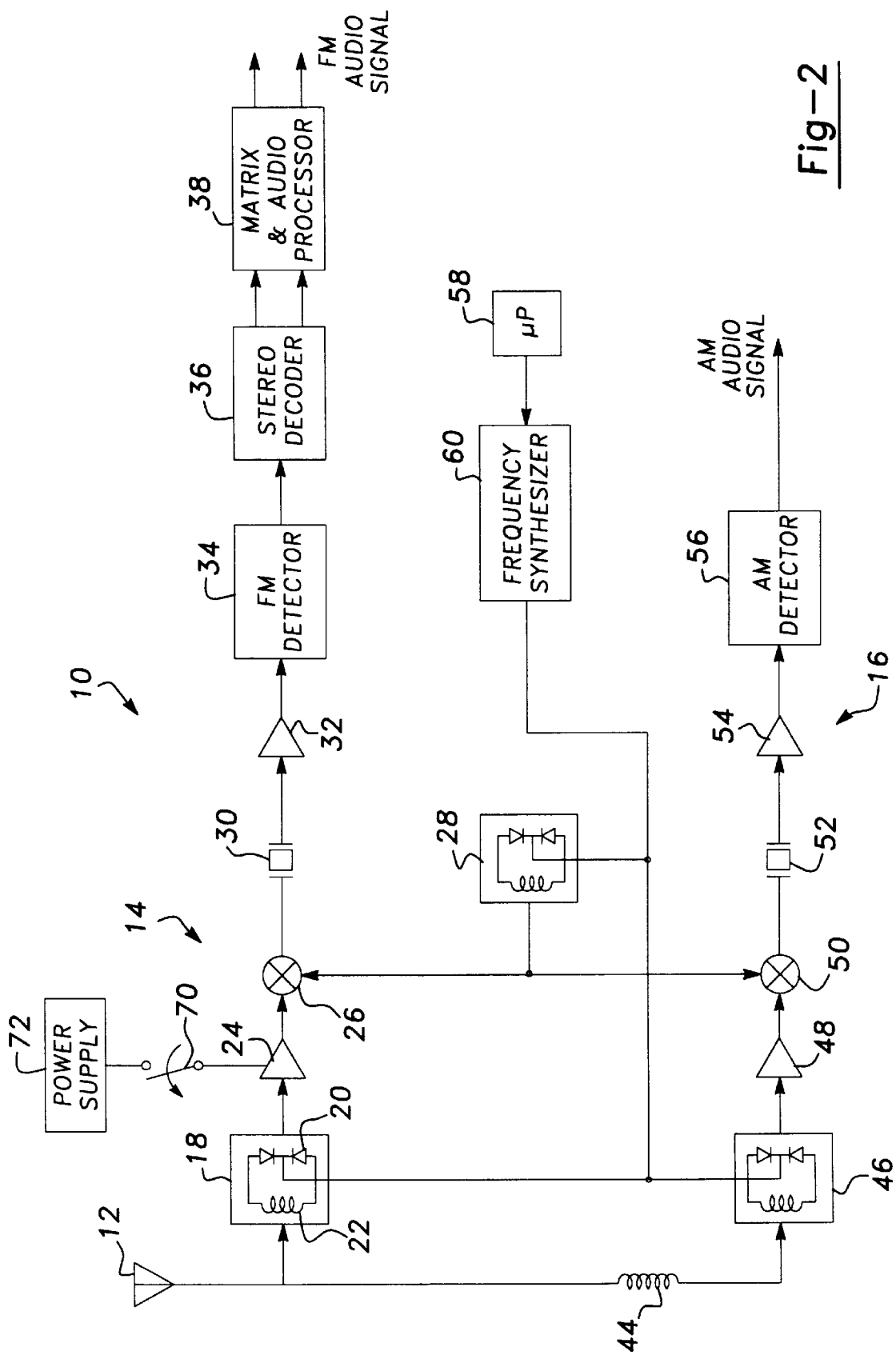
FIG. 2 is a schematic block diagram of an AM/FM receiver including circuitry for minimizing intermodulation products causing FM intrusion, according to another embodiment of the present invention.

FIG. 2 shows a schematic block diagram of the AM/FM receiver 10 to include suitable circuitry for deactivating the FM receiver 14 to reduce or eliminate FM intrusion, according to another embodiment of the present invention. In this embodiment, the switches 66 and 68 have been eliminated, and another switch 70 is provided. The switch 70 switches off the power to the FM front end from a power supply 72, thus eliminating the front end as an active device. Particularly, the power supply for the amplifier 24 is electronically disconnected so as to keep the amplifier 24 from providing signal gain to the undesired signals, and thus creating the potential for overdriving the nonlinear components in the FM front end. Therefore, the switch 70 is open when the receiver 10 is in the AM mode, and is closed when the receiver 10 is in the FM mode. This second technique is potentially more effective than the first technique, as discussed above, but may require more circuitry, and therefore more cost due to switching of the power supplies.

The techniques discussed above filter out the FM signals that cause the undesired intermodulation components. By attenuating or preventing the strong FM signals from getting into the FM front end circuitry, the possibility of the FM front end circuitry going non-linear is greatly reduced, thus reducing FM intrusion in the AM receiver section 16. The direction of the deliberate mis-alignment of the tank circuit 18 is dictated by the presence of undesired strong signals either above or below the FM band. The mis-alignment should be in the direction that avoids any of the strong signals.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

The embodiments of this invention in which an exclusive property or privilege is claimed are defined as follows:

1. An AM/FM receiver, said receiver being selectively activated to be in an AM mode or an FM mode, said receiver comprising:

an antenna responsive to a range of AM and FM radio frequency signals;

an FM receiver section responsive to FM signals from the antenna, said FM receiver section including an FM tuner circuit that is selectively controllable to tune the FM signals to a selected center frequency in the FM frequency range;

an AM receiver section responsive to AM signals from the antenna, said AM receiver section including an AM tuner circuit that is selectively controllable to tune the AM signals to a selected center frequency in the AM frequency range;

a first switch connected between the FM tuner circuit and the AM tuner circuit; and a second switch connected between the FM tuner circuit and a reference potential, said first switch being switched open when the receiver is in the AM mode so as to prevent signals in the FM tuner circuit from reaching the AM tuner circuit, arid the second switch being switched closed when the receiver is in the AM mode to connect the FM tuner circuit to the reference potential, said first and second switches acting to reduce FM intrusion in the AM tuner circuit when the receiver is in the AM mode.

2. The receiver according to claim 1 wherein the reference potential is a ground potential.

3. The receiver according to claim 1 wherein the AM tuner circuit and FM tuner circuit are both tunable tank circuits.

4. The receiver according to claim 3 wherein the tank circuits are controlled by a tuning voltage from a frequency synthesizer to tune the tank circuits to a desired frequency.

5. The receiver according to claim 1 further comprising an isolation choke, said isolation choke being connected between the antenna and the AM tuner circuit, said isolation choke being a high impedance path for FM signals and a low impedance path for AM signals.

6. A method of reducing FM intrusion in an AM receiver section of an AM/FM receiver when the AM/FM receiver is in an AM mode, said method comprising the steps of:

providing an antenna responsive to a range of AM and FM frequencies signals;

providing an FM receiver section responsive to FM signals from the antenna, said step of providing an FM receiver section including providing an FM tuner circuit that tunes the FM signals to a selected center frequency in the FM frequency range;

providing an AM receiver section responsive to AM signals from the antenna, said step of providing an AM receiver section including providing an AM tuner circuit that tunes the AM signals to a selected center frequency in the AM frequency range; and deactivating the FM tuner circuit when the receiver is in the AM mode so as to reduce FM intrusion in the AM tuner circuit, wherein the step of deactivating the FM tuner circuit includes the steps of providing a first switch connected between the FM tuner circuit and the AM tuner circuit, providing a second switch connected between the FM tuner circuit and a reference potential, opening the first switch when the receiver is in the AM mode to prevent signals in the FM tuner circuit from reaching the AM tuner circuit, and closing the second switch to connect the FM tuner circuit to the reference potential.

7. The method according to claim 6 wherein the step of providing an FM tuner circuit includes providing a tunable tank circuit and the step of providing an AM tuner circuit includes providing an tunable tank circuit.

8. The method according to claim 6 wherein the reference potential is a ground potential.

9. The method according to claim 6 further comprising the step of providing an isolation choke connected between the antenna and the AM tuner circuit, said isolation choke preventing FM signals from the antenna from the reaching the AM tuner circuit.

* * * * *